(12) United States Patent
Shim et al.

(10) Patent No.: US 9,130,038 B2
(45) Date of Patent: Sep. 8, 2015

(54) THREE-DIMENSIONAL SEMICONDUCTOR MEMORY DEVICE, MEMORY SYSTEM INCLUDING THE SAME, METHOD OF MANUFACTURING THE SAME AND METHOD OF OPERATING THE SAME

(71) Applicant: SK hynix Inc., Icheon-si Gyeonggi-do (KR)

(72) Inventors: Sa Yong Shim, Icheon-si (KR); Kyoung Jin Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 290 days.

(21) Appl. No.: 13/718,905

(22) Filed: Dec. 18, 2012

(65) Prior Publication Data

US 2014/0063936 A1    Mar. 6, 2014

(30) Foreign Application Priority Data

Aug. 31, 2012 (KR) .................. 10-2012-0096481

(51) Int. Cl.
| | |
|---|---|
| *G11C 11/34* | (2006.01) |
| *H01L 29/78* | (2006.01) |
| *G11C 16/04* | (2006.01) |
| *H01L 29/66* | (2006.01) |
| *G11C 16/10* | (2006.01) |
| *H01L 29/792* | (2006.01) |
| *H01L 27/115* | (2006.01) |

(52) U.S. Cl.
CPC ........ *H01L 29/7827* (2013.01); *G11C 16/0466* (2013.01); *G11C 16/10* (2013.01); *H01L 27/11582* (2013.01); *H01L 29/66666* (2013.01); *H01L 29/66833* (2013.01); *H01L 29/7926* (2013.01); *H01L 27/1157* (2013.01)

(58) Field of Classification Search
USPC .................................. 365/184, 185.05, 51, 63
See application file for complete search history.

(56) References Cited

U.S. PATENT DOCUMENTS

| | | | | |
|---|---|---|---|---|
| 8,698,231 | B2 * | 4/2014 | Lee et al. ....................... | 257/329 |
| 8,717,814 | B2 * | 5/2014 | Choi et al. ............... | 365/185.05 |
| 8,853,767 | B2 * | 10/2014 | Lee et al. ....................... | 257/324 |
| 2013/0301350 | A1 * | 11/2013 | Choe et al. ..................... | 365/184 |

FOREIGN PATENT DOCUMENTS

| | | |
|---|---|---|
| KR | 10-2010-0087743 A | 8/2010 |
| KR | 1020120094818 A | 8/2012 |

* cited by examiner

*Primary Examiner* — Pho M Luu
(74) *Attorney, Agent, or Firm* — William Park & Associates Ltd.

(57) ABSTRACT

A semiconductor memory device, a memory system including the same, a method of manufacturing the same and a method of operating the same are provided. The semiconductor memory device includes a pipe channel layer, vertical channel layers coupled to a top surface of the pipe channel layer, a first pipe gate substantially surrounding a bottom surface and side surfaces of the pipe channel layer, a boosting gate formed over the pipe channel layer, and first insulating layers and conductive layers alternately stacked over the boosting gate and the pipe channel layer.

26 Claims, 15 Drawing Sheets

[program]

[ Erase ]

THREE-DIMENSIONAL SEMICONDUCTOR MEMORY DEVICE, MEMORY SYSTEM INCLUDING THE SAME, METHOD OF MANUFACTURING THE SAME AND METHOD OF OPERATING THE SAME

CROSS-REFERENCE TO RELATED APPLICATION

The present application claims priority to Korean patent application number 10-2012-0096481 filed on Aug. 31, 2012, in the Korean Intellectual Property Office, the entire disclosure of which is incorporated by reference herein.

BACKGROUND

1. Technical Field

Various embodiments generally relate generally to a three-dimensional semiconductor memory device, a memory system including the same, a method of manufacturing the same and a method of operating the same and, more particularly, to a three-dimensional non-volatile memory device.

2. Related Art

The development of semiconductor memory devices is showing a tendency toward increasing integration density and storing a high capacity of data. In general, a two-dimensional (2D) memory device is arranged on a semiconductor substrate in a row direction. Therefore, a semiconductor substrate having a larger area may be required to store a high capacity of data. However, as the integration density of 2D memory devices increases, interference and disturbance between adjacent devices may increase. As a result, multi-level cell (MLC) operations allowing for easy storage of a high capacity of data may be complicated. To overcome such limitations of these 2D memory devices, three-dimensional (3D) memory devices have been developed.

In a 3D memory device, memory cells may be stacked in a direction perpendicular to a semiconductor substrate. Thus, the 3D memory device may have a high integration density and a large data capacity in comparison with a 2D memory device where memory cells are arranged only in row directions.

These memory cells of the 3-dimensional memory device may include a plurality of conductive layers and a plurality of interlayer insulating layers, which are alternately stacked, and vertical channel layers configured to pass through the plurality of conductive layers and the plurality of interlayer insulating layers. Recently, a diversity of techniques for improving the reliability of 3D memory devices have been proposed.

BRIEF SUMMARY

Various embodiments relate to a three-dimensional semiconductor memory device and a method of manufacturing the same capable of reducing the operation time of the three-dimensional semiconductor memory device.

A semiconductor memory device according to an embodiment includes a pipe channel layer, vertical channel layers coupled to a top surface of the pipe channel layer, a first pipe gate substantially surrounding a bottom surface and side surfaces of the pipe channel layer, a boosting gate formed over the pipe channel layer, and first insulating layers and conductive layers alternately stacked over the boosting gate and the pipe channel layer.

A method of manufacturing a semiconductor memory device according to an embodiment includes forming a first conductive layer configured as a first pipe gate, forming a first trench by etching the first conductive layer, filling the first trench with a sacrificial layer, forming a second conductive layer configured as a boosting gate over the sacrificial layer, alternately forming first material layers and second material layers over a resultant structure including the second conductive layer, forming channel holes communicating with the first trench by etching the first material layers and the second material layers, removing the sacrificial layer exposed on bottom surfaces of the channel holes, and forming a channel layer in the channel holes and the first trench from which the sacrificial layer is removed.

A method of manufacturing a semiconductor memory device according to an embodiment includes forming a first conductive layer configured as a first pipe gate, forming a first trench by etching the first conductive layer, filling the first trench with an auxiliary layer, doping the auxiliary layer with impurities by a predetermined depth and transforming a top portion of the auxiliary layer into a second conductive layer, alternately forming first material layers and second material layers over a resultant structure including the second conductive layer, forming channel holes coupled to the second conductive layer by etching the first material layers and the second material layers, forming a channel layer in the channel holes, forming a second trench through which the second conductive layer is exposed by etching the first material layers and the second material layers between the channel holes, and filling the second trench with a third conductive layer configured as a boosting gate.

BRIEF DESCRIPTION OF THE DRAWINGS

FIGS. 7A to 12A are cross-sectional views illustrating a semiconductor memory device according to various embodiments;

FIGS. 7B to 12B are plan views of FIGS. 7A to 12A, respectively; and

DETAILED DESCRIPTION

Hereinafter, various embodiments will be described in detail with reference to the accompanying drawings. The embodiments may, however, be embodied in different forms and should not be construed as limited to the embodiments set forth herein. Rather, these embodiments are provided so that this disclosure will be thorough and complete, and will fully convey the scope of the disclosure to those skilled in the art.

FIGS. 1A to 1I are cross-sectional views illustrating a process flow for manufacturing a semiconductor memory device according to a first embodiment.

Figure 1A:
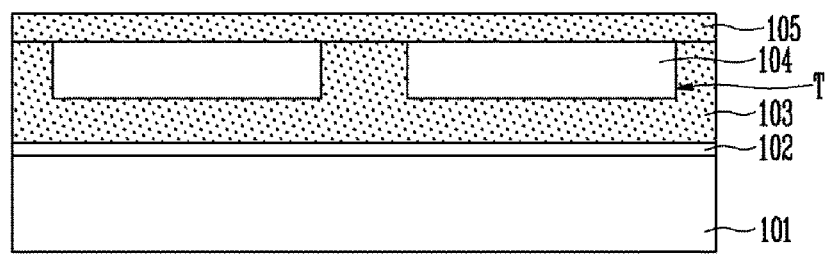
FIGS. 1A to 1I are cross-sectional views of a process flow for illustrating a semiconductor memory device according to a first embodiment.

Referring to FIG. 1A, a first interlayer insulating layer 102 and a first conductive layer 103 may be configured as first pipe gates may be sequentially formed over a semiconductor substrate 101. The first interlayer insulating layer 102 may include an oxide layer, and the first conductive layer 103 may include a polysilicon layer. Subsequently, portions of the first conductive layer 103 in a pipe gate region may be etched to form first trenches T1. The first trenches T1 may be filled with sacrificial layers 104. A second conductive layer 105 configured as second pipe gates may be further formed over the sacrificial layer 104 and the first conductive layer 103 in order to enhance an electric field applied to a vertical channel layer to be subsequently formed. The second conductive layer 105 may include a polysilicon layer.

Figure 1B:
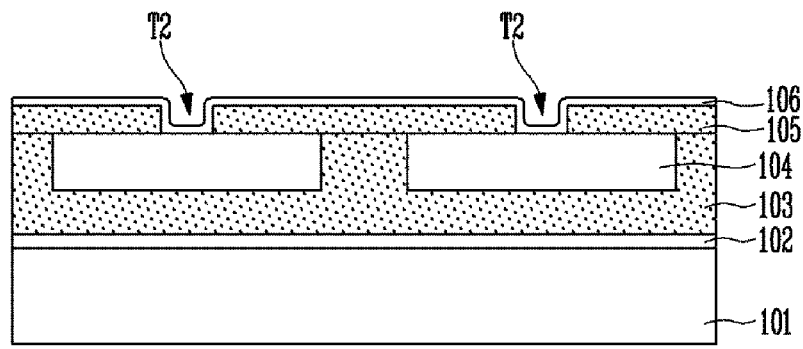

Referring to FIG. 1B, portions of the second conductive layer 105 may be etched to form second trenches T2, through which portions of the sacrificial layer 104 may be exposed. As illustrated in the cross-sectional view of FIG. 1B, only the portions of the sacrificial layer 104 may be exposed since the second trenches T2 have linear shapes. Though not illustrated in FIG. 1B, portions of the first conductive layer 103 may also be exposed through the second trenches T2. A detailed planar structure thereof is described below with reference to FIG. 2. Subsequently, a first insulating layer 106 may be formed along the entire structure including the second trenches T2. For example, the first insulating layer 106 may include an oxide layer.

Figure 1C:
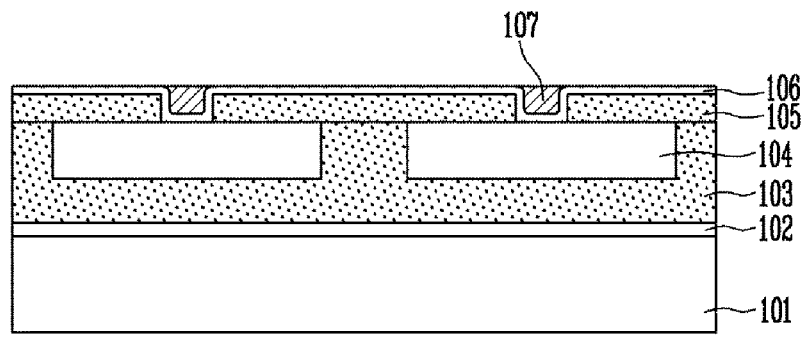

Referring to FIG. 1C, a third conductive layer 107 configured as boosting gates may be formed in the second trenches T2. The third conductive layer 107 may be formed to improve an erase operation speed and may include a conductive layer with low resistance. For example, the third conductive layer 107 may be formed of tungsten (W), tungsten-silicide (WSix), copper (Cu), copper-silicide (CuSix), or aluminum (Al). A metal layer configured as the third conductive layers 107 may be formed over the first insulating layer 106 to completely fill the second trenches T2. Subsequently, an etch process may be performed so that the third conductive layer 107 may remain only in the second trenches T2. An etch process may be further performed to remove the first insulating layer 106 formed over the second conductive layer 105.

Figure 2:
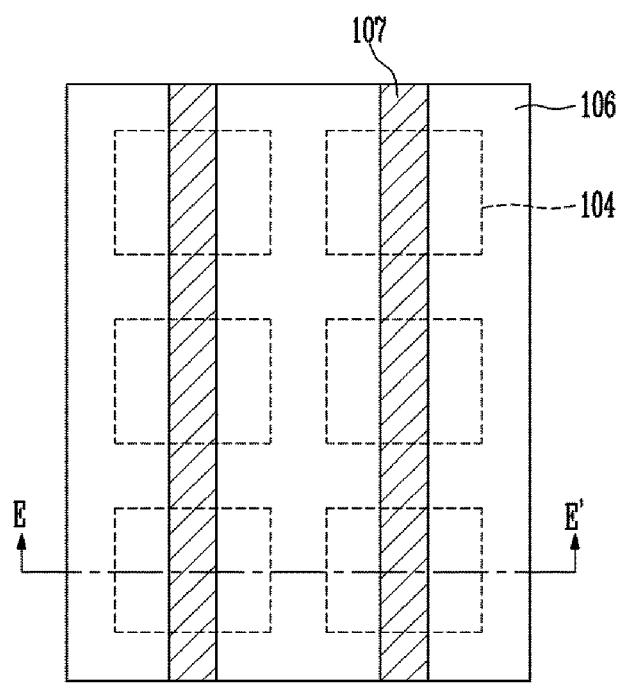
FIG. 2 is a plan view of FIG. 1C.

The third conductive layer 107 configured as boosting gates may have a linear shape as illustrated in plan view of FIG. 2. For reference, FIG. 1C is a cross-sectional view taken along line E-E' of FIG. 2.

Figure 1D:
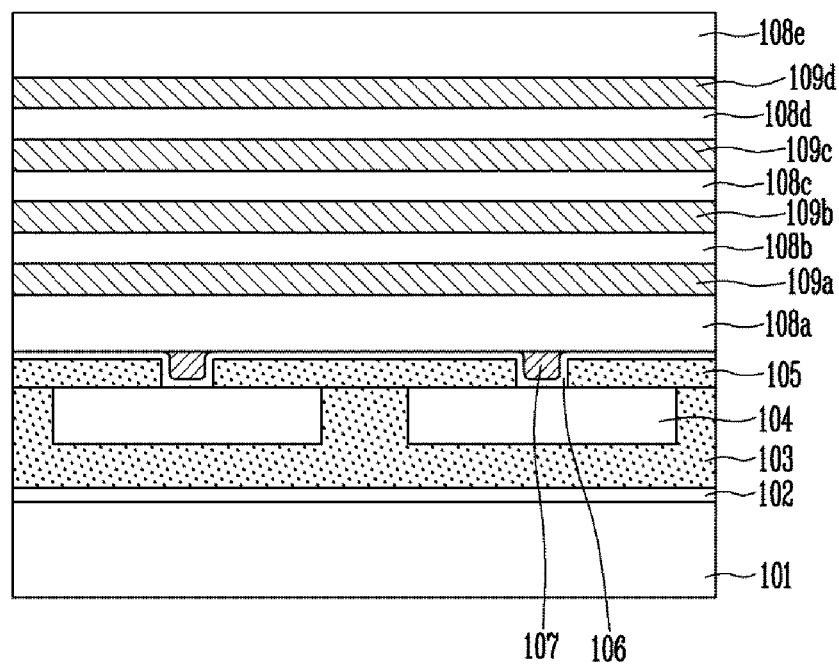

Referring to FIG. 1D, a plurality of first material layers 108a, 108b, 108c, 108d and 108e and a plurality of second material layers 109a, 109b, 109c and 109d may be alternately stacked over the first insulating layer 106 and the third conductive layer 107. For example, the first material layers 108a, 108b, 108c, 108d and 108e may include insulating layers (for example, oxide layers), and the second material layers 109a, 109b, 109c and 109d may include conductive layers (for example, doped polysilicon layers).

Figure 1E:
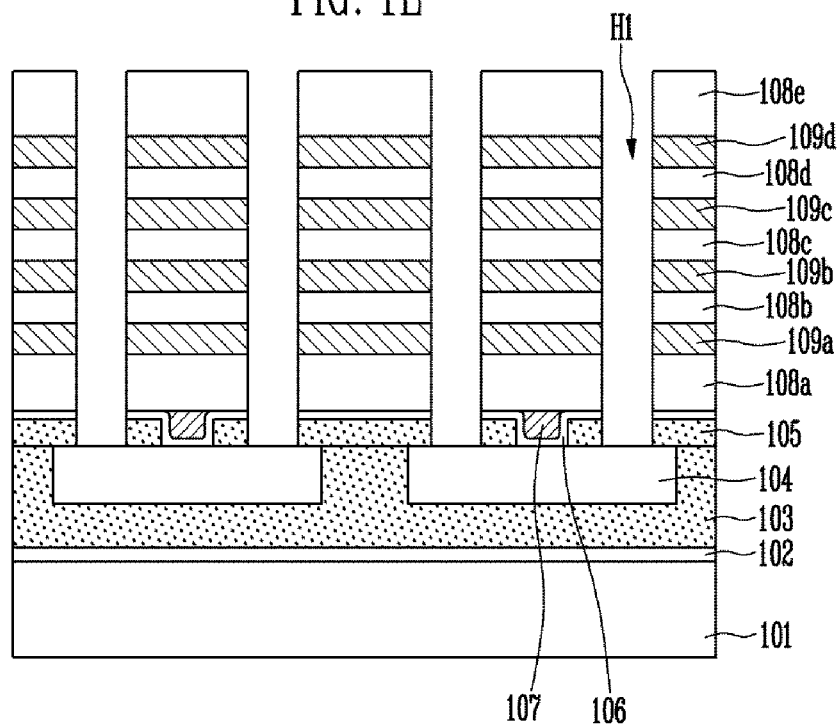

Referring to FIG. 1E, portions of the plurality of first material layers 108a, 108b, 108c, 108d and 108e and portions of the plurality of second material layers 109a, 109b, 109c and 109d may be etched to form channel holes H1. Portions at both ends of each sacrificial layer 104 may be exposed through each pair of the channel holes H1.

Figure 1F:
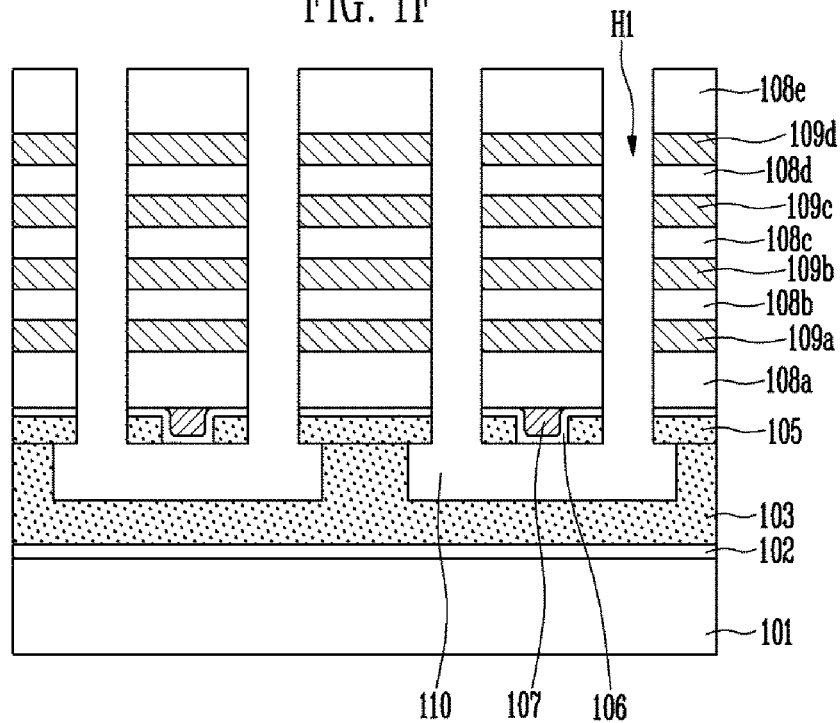

Referring to FIG. 1F, an etch process may be performed to remove the sacrificial layers 104 exposed through the channel holes H1. The first conductive layer 103 may be exposed through a space 110 from which the sacrificial layer 104 is removed.

Figure 1G:
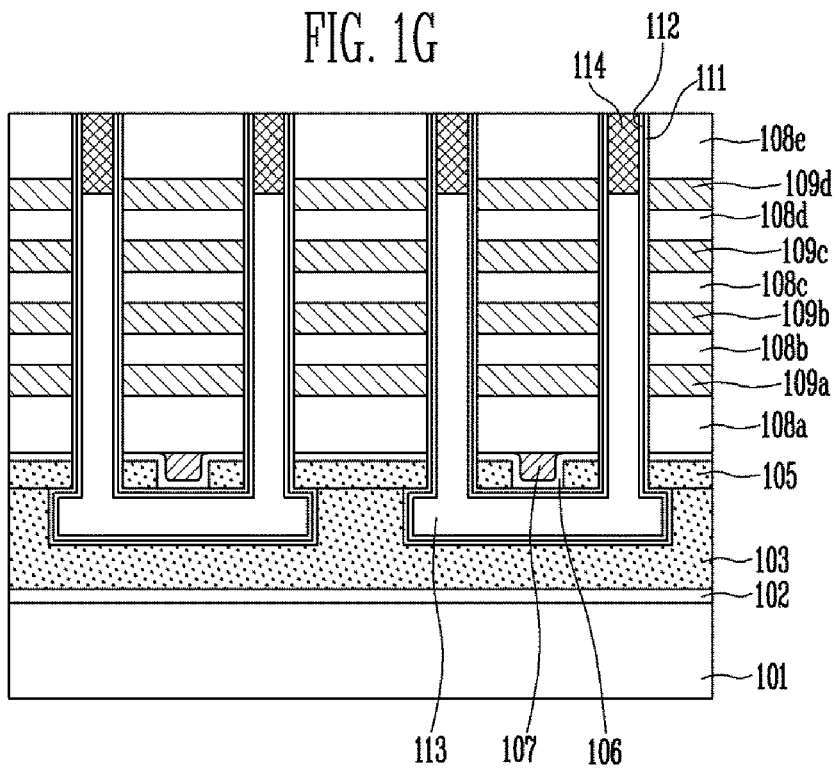

Referring to FIG. 1G, a charge trap layer 111 used for charge storage may be formed along surfaces of the channel hole H1 and the space 110 from which the sacrificial layer 104 is removed. The charge trap layer 111 may include a blocking insulating layer, a trap layer and a tunnel insulating layer. The blocking insulating layer may include an oxide layer to perform a blocking function between the second material layers 109a, 109b, 109c and 109d and the trap layer. The trap layer may include a nitride layer in order to trap charges. The tunnel insulating layer may include an oxide layer.

Subsequently, the channel holes H1 may be filled with a conductive material or an insulating material. When the channel hole H1 is filled with a conductive material, the channel hole H1 may have a filled structure. When the channel hole H1 is filled with an insulating material, the channel hole H1 may have a macaroni structure.

As for the macaroni structure, a channel layer 112 may be formed along a surface of the charge trap layer 111. For example, the channel layer 112 may include a polysilicon layer. The charge trap layer 111 and the channel layer 112 may have a thickness not to fill up the central space of the channel hole H1. Subsequently, the channel hole H1 having the channel layer 112 formed thereon may be filled with a second insulating layer 113. The second insulating layer 113 may include an oxide layer to achieve electrical insulation. In order to completely fill the channel hole H1, the second insulating layer 113 may be formed of a flowable material such as an SOD layer.

Portions of the second insulating layer 113 above the channel hole H1 may be removed to form recesses through which top portions of the channel layer 112 are exposed. Subsequently, capping layers 114 may be formed in the recesses. The capping layers 114 may include conductive materials since the capping layers 114 are formed to reduce contact resistance of the channel layer 112. For example, the capping layer 114 may include a polysilicon layer doped with impurities. As for the filled structure, the channel hole H1 having the charge trap layer 111 formed thereon may be filled with a conductive material. In this embodiment, a semiconductor memory device having a macaroni structure will be exemplified.

Figure 1H:
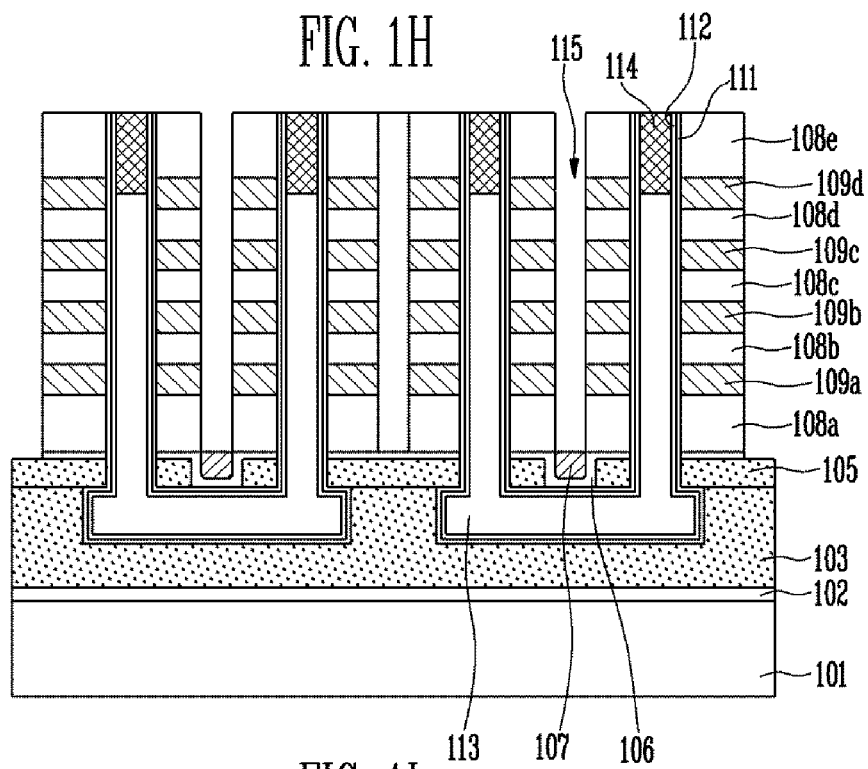

Referring to FIG. 1H, the plurality of first material layers 108a, 108b, 108c, 108d and 108e and the plurality of second material layers 109a, 109b, 109c and 109d formed between the channel layers 112 may be etched to form slits 115. The slits 115 may be formed between adjacent channel layers 112 and arranged in a row direction. Therefore, sidewalls of the plurality of first material layers 108a, 108b, 108c, 108d and 108e and the plurality of second material layers 109a, 109b, 109c and 109d may be exposed through the slits 115.

Figure 1I:
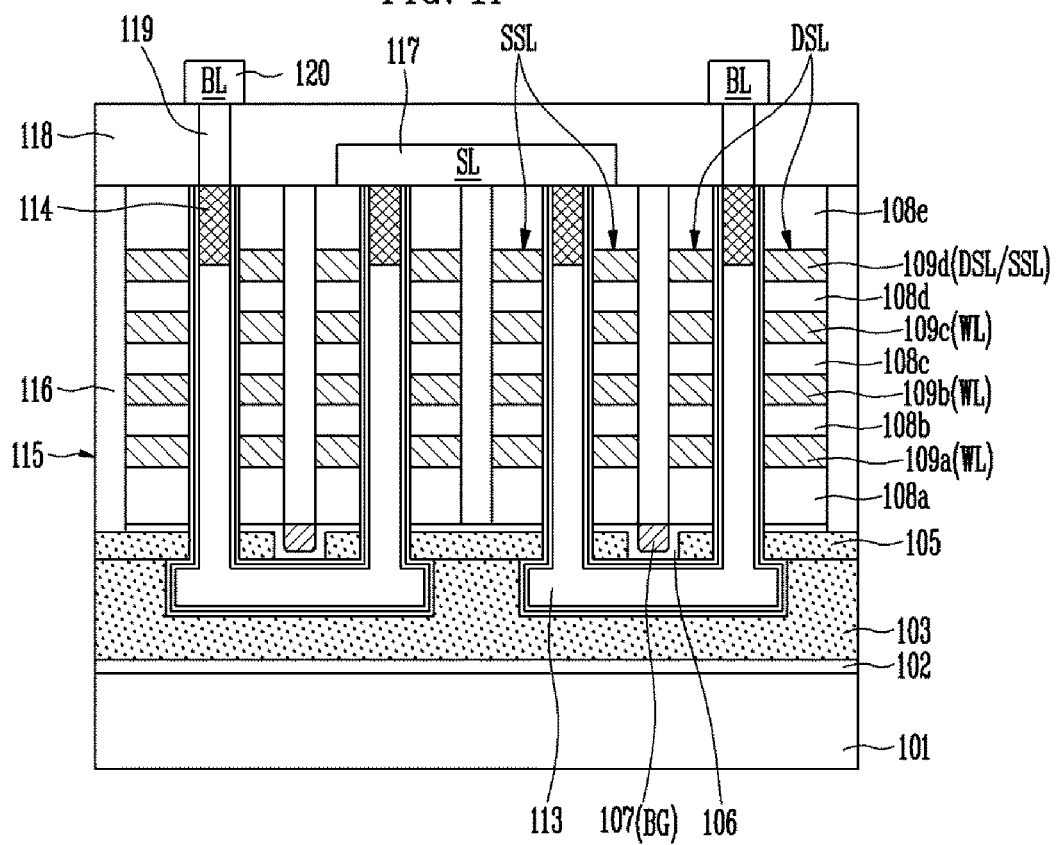

Referring to FIG. 1I, the slits 115 may be filled with third insulating layers 116. The third insulating layers 116 may include oxide layers.

Subsequently, a source line (SL) 117 may be formed over the capping layer 114 formed in one of each pair of the channel holes H1. A second interlayer insulating layer 118 may be formed over the entire structure. The source line SL may include a polysilicon layer or a tungsten layer, and the second interlayer insulating layer 118 may include an oxide layer. Portions of the second interlayer insulating layer 118 may be etched to form contact holes, through each of which the capping layer 114 formed in the other channel hole H1 of each pair of the channel holes H1 is exposed. The contact hole may be filled with fourth conductive layers 119. Subsequently, bit lines (BL) 120 may be formed over the fourth conductive layers 119 formed in the contact holes. The bit lines (BL) 120 may include polysilicon layers or tungsten layers.

Therefore, at least one upper layer of the second material layers 109a, 109b, 109c and 109d may be a drain selection line DSL or a source selection line SSL, and other conductive layers may be word lines WL. For example, the second material layer 109d surrounding the capping layer 114 coupled to the bit line BL may be the drain selection line DSL, and the second material layer 109d surrounding the capping layer 114 coupled to the source line SL may be the source selection line SSL. In addition, the remaining second material layers 109b, 109c and 109d surrounding the charge trap layer 111 may be the word lines WL.

The channel layer 112 formed in the trench of the first conductive layer 103 configured as pipe gates may be a pipe channel layer, and the channel layer 112 formed in the channel holes H1 may be vertical channel layers substantially perpendicularly coupled to the pipe channel layer. Therefore, a semiconductor memory device may include pipe channel layers, vertical channel layers, the third conductive layer 107 configured as boosting gates contacting top surfaces of the pipe channel layers, and the first insulating layer 106 between the third conductive layer 107 and the first conductive layer 103 configured as pipe gates. When the third conductive layer 107 configured as boosting gates is formed around the pipe channel layer, the same voltage as an erase voltage supplied to the source line SL during an erase operation may be supplied to improve an erase operation speed. Methods of performing program, erase and read operations will be described below in detail with reference to FIGS. 4 to 6.

According to the above-described embodiment of the invention, a method of manufacturing the semiconductor memory device including the boosting gates BG having linear shapes adjacent to lower parts of the U-shaped channel layer 112 is described. However, the boosting gates BG may have various configurations in addition to the above-described configuration obtained by using the above-described manufacturing method. A method of manufacturing a semiconductor memory device including the boosting gates BG according to another embodiment is described below.

FIGS. 3A to 3H are cross-sectional views of a process flow for illustrating a method of a semiconductor memory device according to a second embodiment.

Figure 3A:
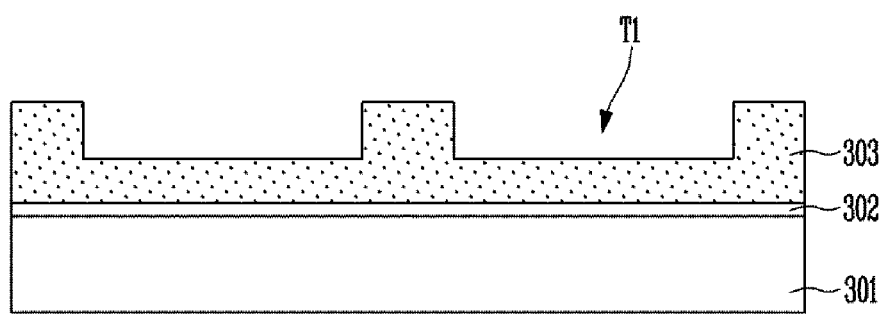
FIGS. 3A to 3H are cross-sectional views of a process flow for illustrating a semiconductor memory device according to a second embodiment.

Referring to FIG. 3A, a first interlayer insulating layer 302 and a first conductive layer 303 configured as first pipe gates may be sequentially formed over a semiconductor substrate 301. The first interlayer insulating layer 302 may include an oxide layer, and the first conductive layer 303 may include a polysilicon layer. Subsequently, portions of the first conductive layer 303 in a pipe gate region may be etched to form first trenches T1.

Figure 3B:
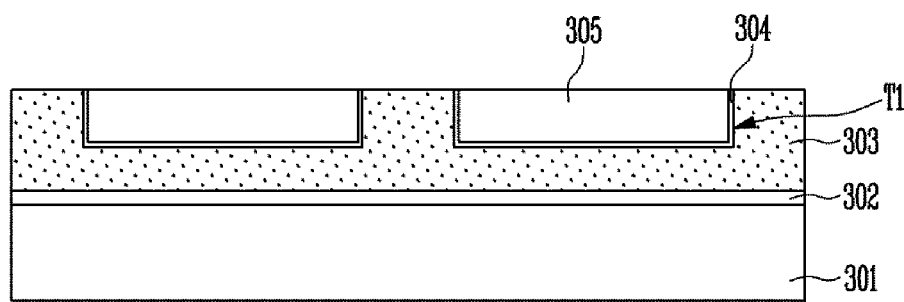

Referring to FIG. 3B, first insulating layers 304 may be formed along surfaces of the first trenches T1. For example, the first insulating layers 304 may include oxide layers. Subsequently, auxiliary layers 305 may be formed in the first trenches T1. The auxiliary layers 305 may include undoped polysilicon layers.

Figure 3C:
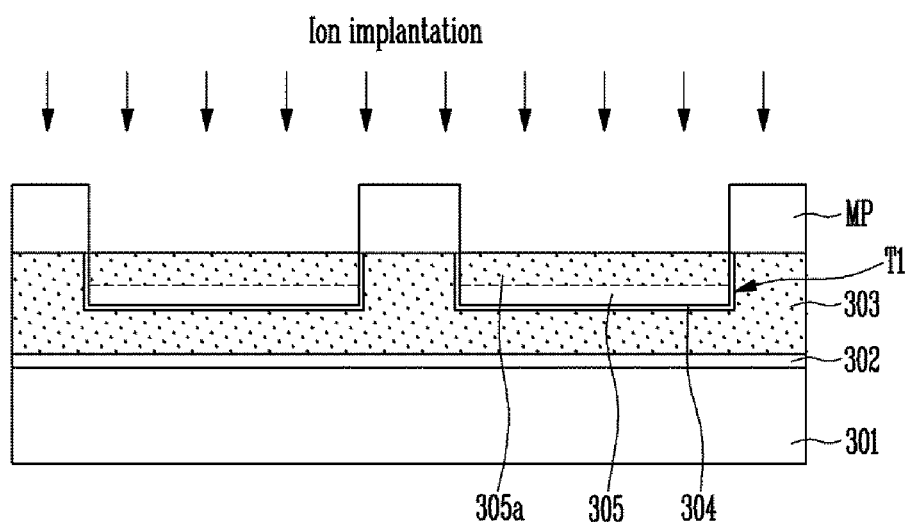

Referring to FIG. 3C, ions may be implanted into the auxiliary layers 305 by a predetermined depth so that the auxiliary layers 305 may have conductivity. For example, a mask pattern MP may be formed over the entire structure so that the auxiliary layers 305 may be exposed through the mask pattern MP. Subsequently, an ion implantation process may be performed. As a result, portions of the auxiliary layers 305 may be transformed into second conductive layers 305a.

Figure 3D:
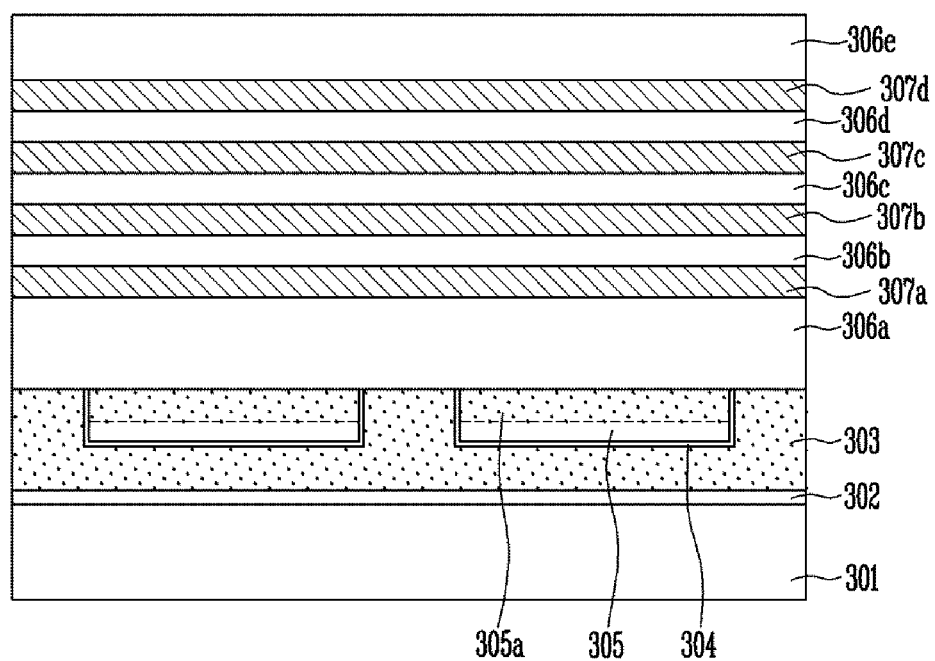

Referring to FIG. 3D, after the mask pattern MP is removed, a plurality of first material layers 306a, 306b, 306c, 306d and 306e and a plurality of second material layers 307a, 307b, 307c and 307d may be alternately stacked over the entire structure. For example, the first material layers 306a, 306b, 306c, 306d and 306e may include oxide layers, and the second material layers 307a, 307b, 307c and 307d may include doped polysilicon layers.

Figure 3E:
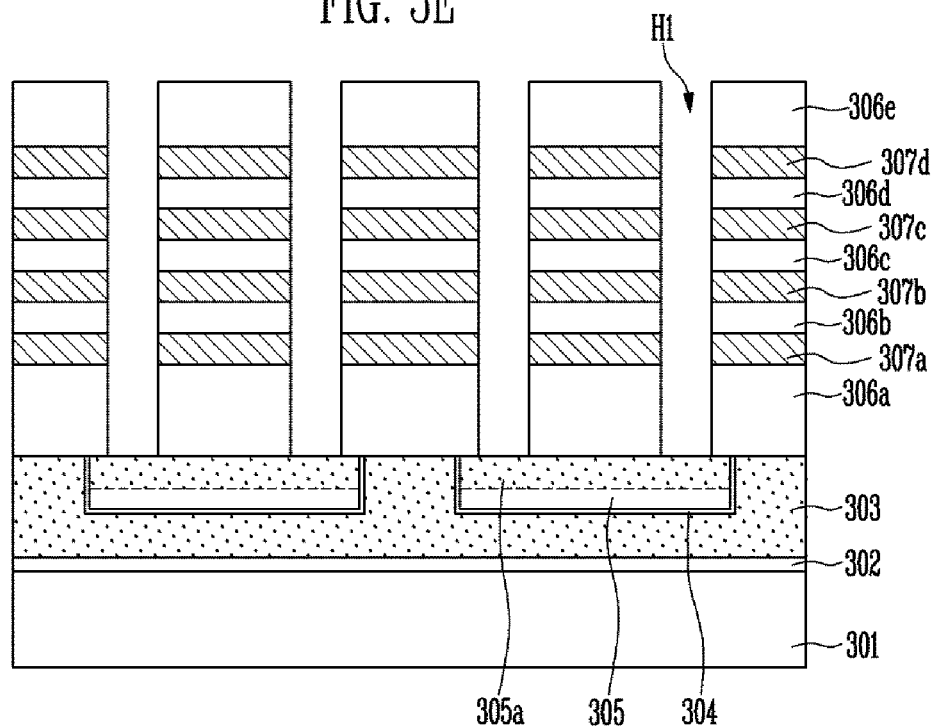

Referring to FIG. 3E, portions of the plurality of first material layers 306a, 306b, 306c, 306d and 306e and portions of the plurality of second material layers 307a, 307b, 307c and 307d may be etched to form a plurality of channel holes H1.

Portions at both ends of each second conductive layer 305a may be exposed through each pair of the channel holes H1.

Figure 3F:
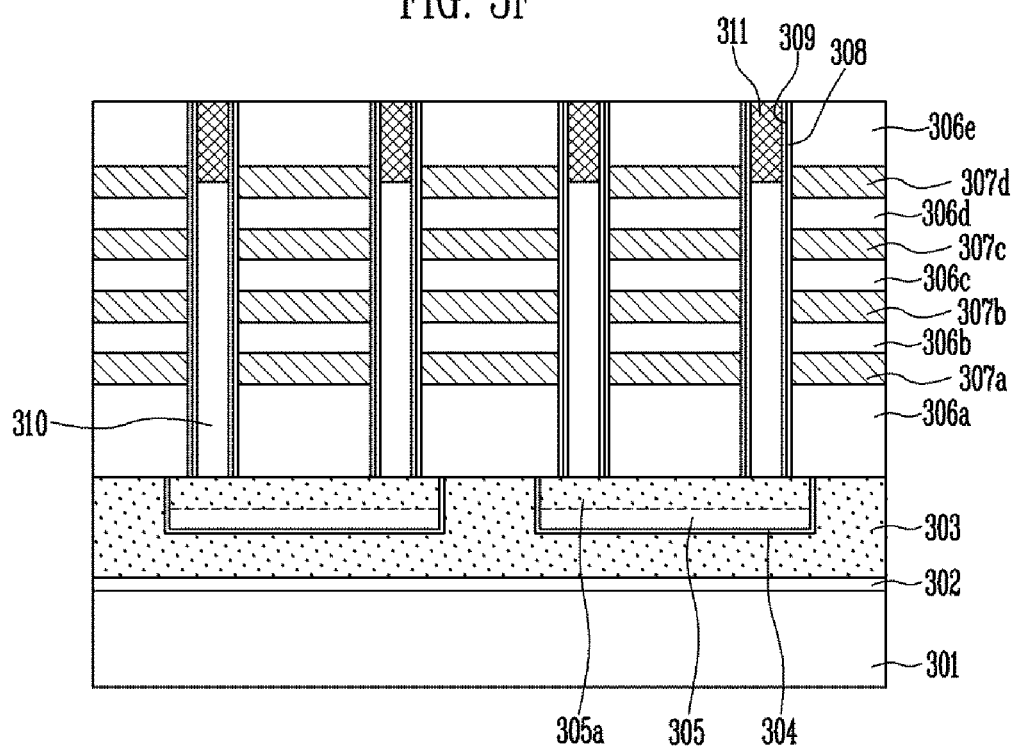

Referring to FIG. 3F, a charge trap layer 308 used for storing charges and a vertical channel layer 309 may be sequentially formed along a surface of each channel hole H1. For example, the charge trap layer 308 may include a blocking insulating layer, a trap layer and a tunnel insulating layer. The blocking insulating layer may include an oxide layer to perform a blocking function between the second material layers 307a, 307b, 307c and 307d and the trap layer. The trap layer may include a nitride layer in order to trap charges. The tunnel insulating layer may include an oxide layer, and the vertical channel layer 309 may include a polysilicon layer. The charge trap layer 308 and the vertical channel layer 309 may have a thickness not to fill up the central space of the channel hole H1.

Subsequently, each channel hole H1 may be filled with a second insulating layer 310. The second insulating layer 310 may include an oxide layer to achieve electrical insulation. In order to fill up the channel hole H1, the second insulating layer 310 may be formed of a flowable material such as an SOD layer. A portion of the second insulating layer 310 above the channel hole H1 may be removed to form a recess through which a top portion of the vertical channel layer 309 is exposed. A capping layer 311 may be further formed in the recess. Since the capping layer 311 is formed to reduce resistance of the vertical channel layer 309, the capping layer 311 may be formed of a conductive material. For example, the capping layer 311 may include a polysilicon layer doped with impurities.

Figure 3G:
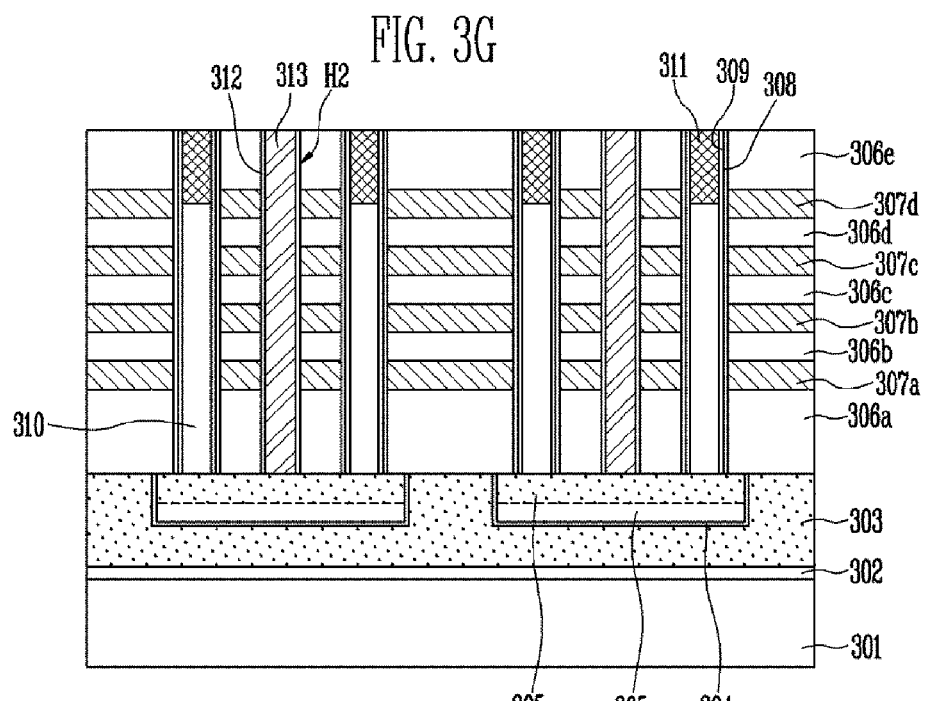

Referring to FIG. 3G, the plurality of first material layers 306a, 306b, 306c, 306d and 306e and the plurality of second material layers 307a, 307b, 307c and 307d formed between the vertical channel layers 309 may be etched to form holes H2 through which the second conductive layers 305a are exposed. Subsequently, a third insulating layer 312 may be formed along a sidewall of each hole H2. For example, the third insulating layer 312 may be formed along the surface of the entire structure including the hole H2, and an etch process may be performed to remove the entire third insulating layer 312, except for a portion of the third insulating layer 312 formed along the sidewall of the hole H2. In other words, the second conductive layer 305a may be exposed on a bottom surface of the hole H2, while the second material layers 307a, 307b, 307c and 307d may not be exposed along the sidewall of the hole H2.

Subsequently, a conductive layer 313 configured as a boosting gate may be formed in the hole H2. For example, the conductive layer 313 configured as a boosting gate may be formed of tungsten (W), tungsten-silicide (WSix), copper (Cu), copper-silicide (CuSix), or aluminum (Al).

Figure 3H:
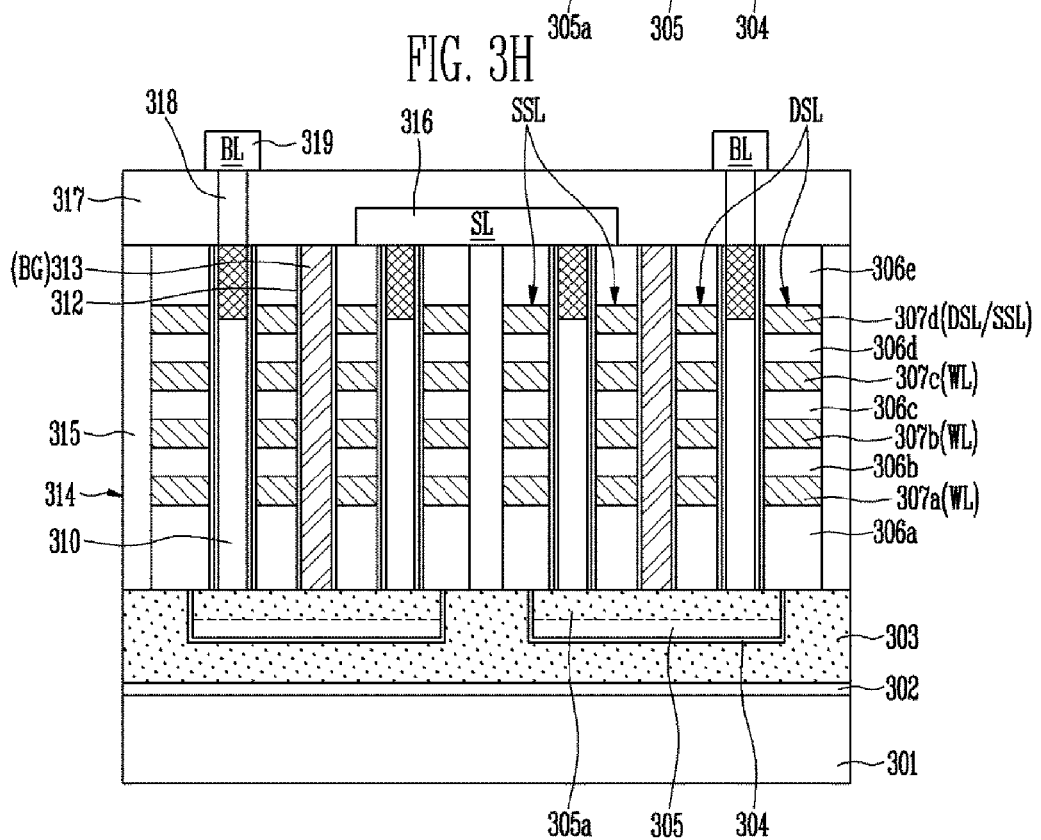

Referring to FIG. 3H, the first material layers 306a, 306b, 306c, 306d and 306e and the second material layers 307a, 307b, 307c and 307d may be etched to form slits 314. The slits 314 may be formed between the adjacent vertical channel layers 309 and arranged in a row direction. As a result, sidewalls of the first material layers 306a, 306b, 306c, 306d and 306e and sidewalls of the second material layers 307a, 307b, 307c and 307d may be exposed through the slits 314. Subsequently, each slit 314 may be filled with a fourth insulating layer 315. The fourth insulating layer 315 may include an oxide layer.

Subsequently, a source line (SL) 316 may be formed over the capping layer 311 formed in one of each pair of the channel holes H1, and a third interlayer insulating layer 317 may be formed over the entire structure. The source line SL may include a polysilicon layer or a tungsten layer. The third interlayer insulating layer 317 may include an oxide layer. Portions of the third interlayer insulating layer 317 may be etched to form contact holes, through each of which the capping layer 311 formed in the other of each pair of the channel holes H1 is exposed. A fourth conductive layer 318 may be formed in the contact hole. Subsequently, a bit line (BL) 319 may be formed over the fourth conductive layer 318 formed in the contact hole. The bit line (BL) 319 may include a polysilicon layer or a tungsten layer.

Therefore, at least one upper layer of the second material layers 307a, 307b, 307c and 307d may be the drain selection line DSL or the source selection line SSL, and other conductive layers may be the word lines WL. For example, the second material layer 307d surrounding the capping layer 311 coupled to the bit line BL may be the drain selection line DSL, and the second material layer 307d surrounding the capping layer 311 coupled to the source line SL may be the source selection line SSL. In addition, the other first material layers 307b, 307c and 307d surrounding the charge trap layer 308 may be the word lines WL. The third conductive layer 313 located at the center of the U-shaped vertical channel layer 309 may be the boosting gate BG. The boosting gate BG may be supplied with the same voltage as a voltage supplied to the source line SL during an erase operation to improve an erase operation speed.

Figure 4:
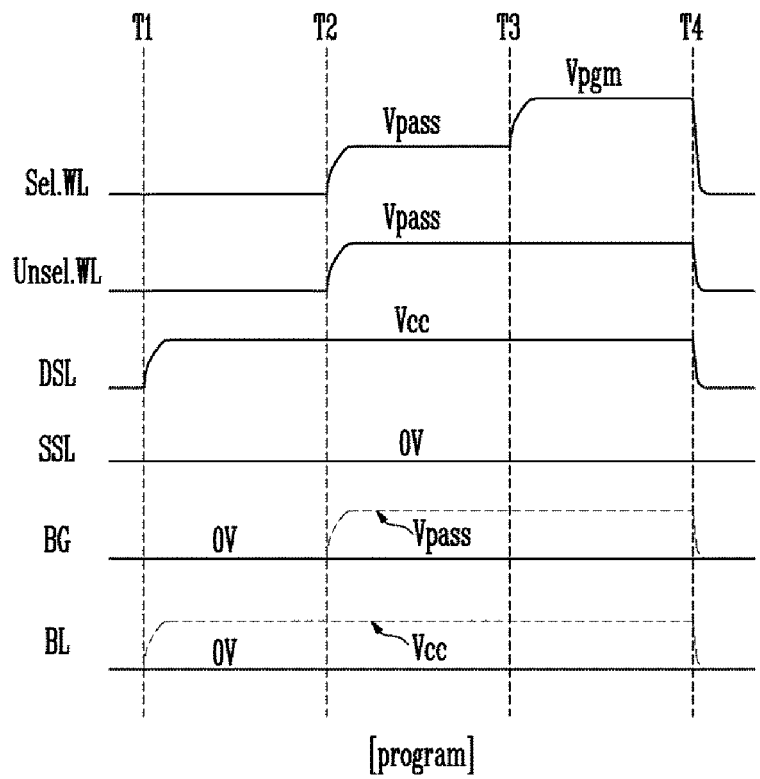
FIG. 4 is a timing diagram illustrating a program method of a semiconductor memory device according to an embodiment.

FIG. 4 is a timing diagram illustrating a program method of a semiconductor memory device according to an embodiment.

A program method is described below with reference to FIG. 4 [program].

Bit Line Setup Period (T1-T2)

A program enable voltage (e.g., 0V) or a program inhibit voltage (e.g., Vcc) may be supplied to the bit lines BL. For example, the bit lines BL may be set up by supplying the program enable voltage to selected bit lines coupled to memory cells to be programmed and supplying the program inhibit voltage to bit lines coupled to memory cells not to be programmed. Subsequently, a turn-on voltage (e.g., Vcc) may be supplied to the drain selection line DSL so that potentials of the bit lines BL may be transferred to vertical channel layers. During a program operation, the turn-on voltage may not be supplied to the source selection line SSL. Therefore, the program enable voltage may be transferred to a vertical channel layer of selected cell strings, and the program inhibit voltage may be transferred to a vertical channel layer of unselected cell strings. A voltage having a ground voltage (e.g., 0V) level may be supplied to the boosting gate BG.

Boosting Period (T2-T3)

In order to boost channels of the unselected cell strings, a program pass voltage Vpass may be supplied to selected word lines (Sel. WL) and unselected word lines (Unsel. WL). Here, a potential having the ground voltage level being supplied to the boosting gate BG of the selected cell strings may be maintained, and the program pass voltage Vpass may be supplied to the boosting gate BG of the unselected cell strings.

Program Voltage Applying Period (T3-T4)

A program voltage Vpgm may be supplied to the selected word lines (Sel. WL) to increase threshold voltages of the selected memory cells.

In the boosting period (T2-T3) of the above-described program operation, when a positive voltage such as the program pass voltage Vpass is supplied to the boosting gate BG of the unselected cell strings, the channels of the unselected cell strings may be quickly boosted, thereby reducing the time of the boosting period (T2-T3).

Figure 5:
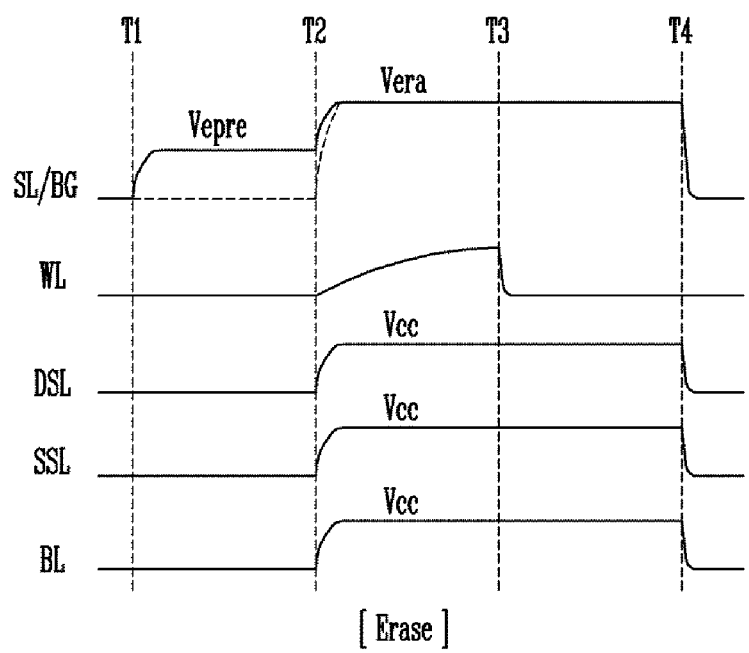
FIG. 5 is a timing diagram illustrating an erase method of a semiconductor memory device according to an embodiment.

FIG. 5 is a timing diagram illustrating an erase method of a semiconductor memory device according to an embodiment.

An erase method is described below with reference to FIG. 5 [Erase].

Pre-Erase Voltage Applying Period (T1-T2)

In a pre-erase voltage applying period, a pre-erase voltage Vepre lower than an erase voltage may be supplied to the source line SL and the boosting gate BG. The pre-erase voltage Vepre may be supplied to the source line SL and the boosting gate BG in order to prevent excessive voltage rise before an erase voltage Vera, which is a high voltage, is supplied.

Boosting Period (T2-T3)

The erase voltage Vera higher than the pre-erase voltage Vepre may be supplied to the source line SL and the boosting gate BG. A positive voltage (e.g., Vcc) may be supplied to every word line WL, and a turn-on voltage (e.g., Vcc) may be supplied to the drain and source selection lines DSL and SSL. The turn-on voltage may be lower than the erase voltage Vera. As a result, a hole current (Gate Induced Drain Leakage (GIDL)) may be generated due to band-to-band tunneling caused by a potential difference between the source line SL and the source selection line SSL. Therefore, the potentials of the vertical channel layers may be increased.

Erasing Period (T3-T4)

When the potential of each word line WL is reduced to the ground voltage (e.g., 0V) level, holes may be injected into the memory cells due to the potential differences between the vertical channel layers and the word lines WL, so that the memory cells may be erased.

In the boosting period (T2-T3) of the above-described erase operation, since the erase voltage Vera is also supplied to the boosting gate BG, a voltage of the vertical channel layer may quickly rise in comparison with a device not provided with the boosting gate BG. Therefore, an erase operation time may be reduced.

Figure 6:
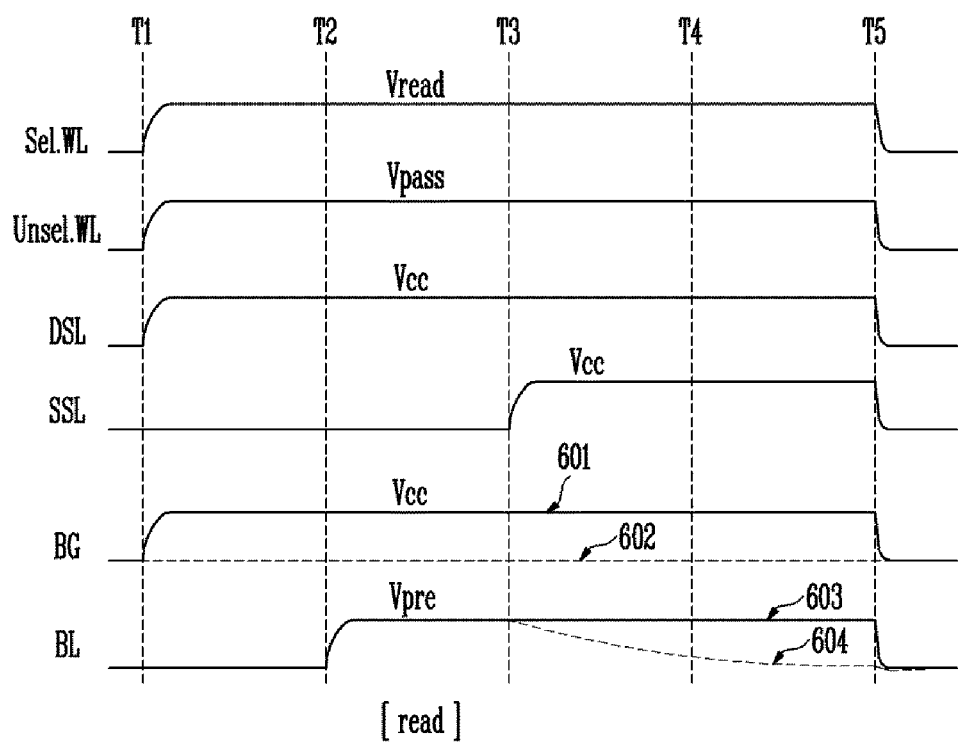
FIG. 6 is a timing diagram illustrating a read method of a semiconductor memory device according to an embodiment.

FIG. 6 is a timing diagram illustrating a read method of a semiconductor memory device.

A read method is described below with reference to FIG. 6 [read].

Word Line Setup Period (T1-T2)

A read voltage Vread may be supplied to the selected word lines (Sel. WL), and the read pass voltage Vpass may be supplied to the other unselected word lines (Unsel. WL). A positive voltage (e.g., Vcc or Vpass) 601 may be supplied to the boosting gate BG of the selected cell strings, and a ground voltage (e.g., 0V) may be supplied to a boosting gate BG of the unselected cell strings.

Bit Line Setup Period (T2-T3)

The bit lines BL coupled to the selected cell strings may be precharged with a positive voltage (Vpre).

Evaluating Period (T3-T4)

The turn-on voltage (e.g., Vcc) may be supplied to the source selection line SSL. When potentials of the selected memory cells are higher than the read voltage Vread, the potentials of the bit lines BL may be maintained at a precharge level (603). When the potentials of the selected memory cells are lower than the read voltage Vread, the potentials of the bit lines BL may be lowered (604). To this end, the source line SL may be coupled beforehand to a ground terminal.

Sensing Period (T4-T5)

By sensing whether the potentials (603 or 604) of the bit lines BL are lower or higher than a reference voltage, data of the selected memory cells may be read.

Since a positive voltage is supplied to the boosting gate BG coupled to the selected cell strings during the above-described read operation, channels may be easily formed in the U-shaped vertical channel layers, and the time taken for the evaluating and sensing operations of the bit lines BL may be reduced.

FIGS. 7A to 12A are cross-sectional views illustrating semiconductor memory devices according to various embodiments. FIGS. 7B to 12B are plan views of FIGS. 7A to 12B, respectively. FIGS. 7A to 12A are views illustrating various examples of a structure of a semiconductor memory device including the boosting gate BG.

Figure 7A:
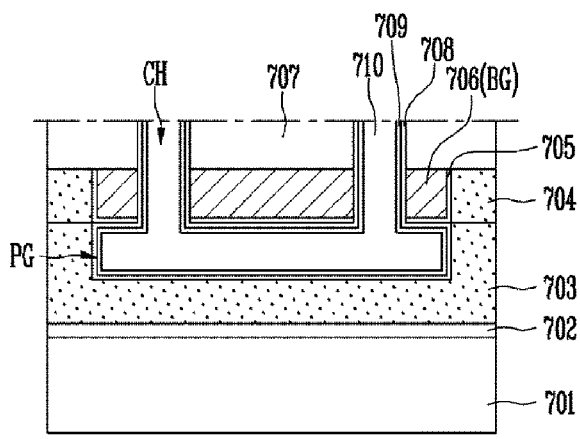

Referring to FIG. 7A, a first interlayer insulating layer 702, a first pipe gate 703, a second pipe gate 704 and a second interlayer insulating layer 707 may be sequentially stacked over a semiconductor substrate 701. The boosting gate BG may be formed in the second pipe gate 704. In order to electrically insulate the boosting gate BG from the second pipe gate 704, an insulating layer 705 may be formed on a bottom surface and side surfaces of the boosting gate BG. A trench may be formed in the first pipe gate 703. A pair of vertical channel holes CH may be formed on top of the trench, and the pair of vertical channel holes CH may pass through the boosting gate BG, the insulating layer 705 and the second interlayer insulating layer 707.

Figure 7B:
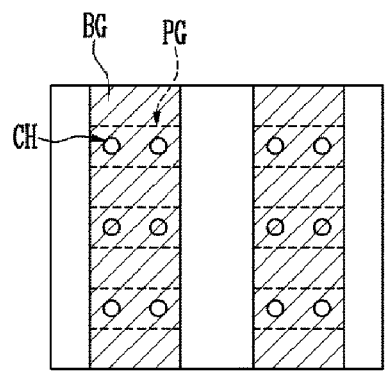

A charge trap layer 708 may be formed along an inner wall of the trench and inner walls of the vertical channel holes CH. A channel layer 709 may be formed along an inner wall of the charge trap layer 708. The remaining internal space of the trench and the vertical channel holes CH communicating with each other may be filled with an insulating material 710. The channel layer 709 formed in the trench may be a pipe channel layer PC, and the channel layer 709 formed in the vertical channel holes CH may be vertical channel layers. Referring to FIG. 7B, each boosting gate BG may have a linear shape so that the boosting gate BG (i.e., 706(BG)) may be coupled in common to the pipe channel layers PC arranged in a predetermined direction. Also shown is a pipe gate PG.

Figure 8A:
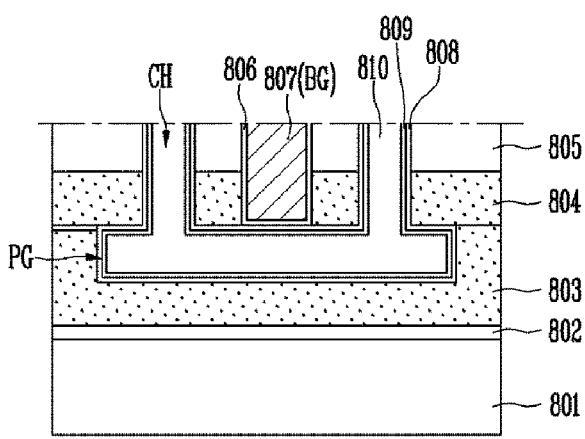

Referring to FIG. 8A, a first interlayer insulating layer 802, a first pipe gate 803, a second pipe gate 804 and a second interlayer insulating layer 805 may be sequentially stacked over a semiconductor substrate 801. The boosting gate BG (i.e., 807(BG)) may perpendicularly pass through the second pipe gate 804 and the second interlayer insulating layer 805. An insulating layer 806 may be formed on a bottom surface and side surfaces of the boosting gate BG in order to electrically insulate the boosting gate BG from the second pipe gate 804.

Figure 8B:
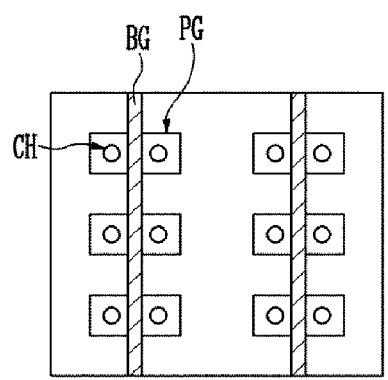

A trench may be formed in the first pipe gate 803. A pair of vertical channel holes CH may be formed on top of the trench and pass through the second pipe gate 804 and the second interlayer insulating layer 805. A charge trap layer 808 may be formed along an inner wall of the trench and inner walls of the vertical channel holes CH. A channel layer 809 may be formed along an inner wall of the charge trap layer 808. The channel layer 809 formed in the trench may be the pipe channel layer PC, and the channel layer 809 formed in the vertical channel holes CH may be the vertical channel layers. The remaining internal space of the trench and the vertical channel holes CH communicating with each other may be filled with an insulating material 810. Referring to FIG. 8B, each boosting gate BG may have a linear shape so that the boosting gate BG may be coupled in common between the vertical channel holes CH of the pipe channel layers PC arranged in a predetermined direction. Also shown is a pipe gate PG.

Figure 9A:
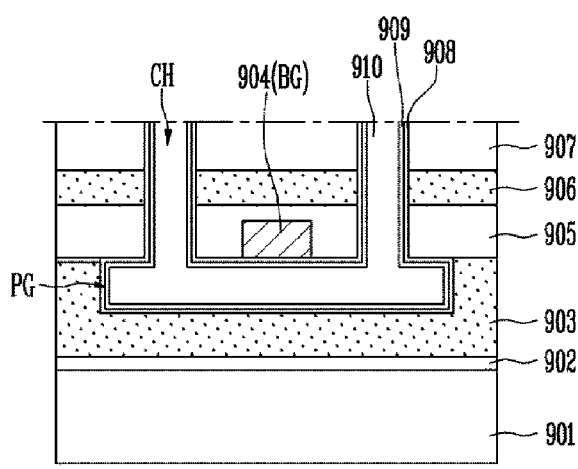

Referring to FIG. 9A, a first interlayer insulating layer 902, a first pipe gate 903, a second interlayer insulating layer 905, a second pipe gate 906 and a third interlayer insulating layer 907 may be sequentially stacked over a semiconductor substrate 901. A boosting gate (BG) 904 may be formed in the second interlayer insulating layer 905 and have a linear shape. A trench may be formed in the first pipe gate 903. A pair of vertical channel holes CH may be formed on top of the trench. The pair of vertical channel holes CH may pass through the second interlayer insulating layer 905, the second pipe gate 906 and the third interlayer insulating layer 907.

Figure 9B:
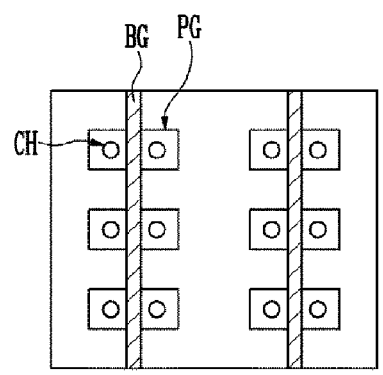

A charge trap layer 908 may be formed along an inner wall of the trench and inner walls of the vertical channel holes CH, and a channel layer 909 may be formed along an inner wall of the charge trap layer 908. The channel layer 909 formed in the trench may be the pipe channel layer PC, and the channel layer 909 formed in the vertical channel holes CH may be the vertical channel layers. The remaining internal space of the trench and the vertical channel holes CH communicating with each other may be filled with an insulating material 910. The boosting gate BG may contact the center of a top surface of a pipe gate PG region between the vertical channel holes CH. Referring to FIG. 9B, each boosting gate BG may have a linear shape so that the boosting gate BG may be disposed between the vertical channel holes CH of the pipe channel layers PC arranged in a predetermined direction.

Figure 10A:
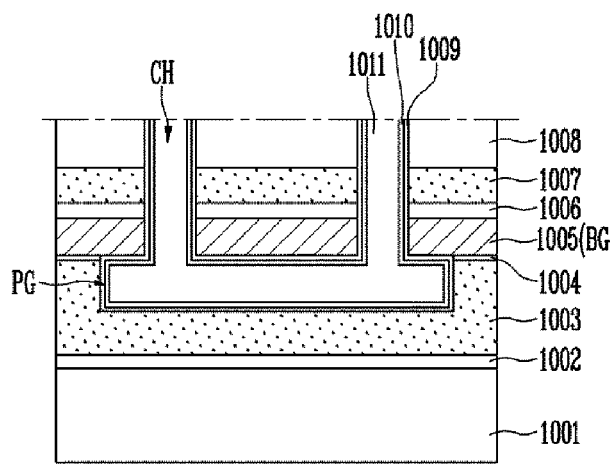

Referring to FIG. 10A, a first interlayer insulating layer 1002, a first pipe gate 1003, a second interlayer insulating layer 1004, a boosting gate (BG) 1005, a third interlayer insulating layer 1006, a second pipe gate 1007 and a fourth interlayer insulating layer 1008 may be sequentially stacked over a semiconductor substrate 1001. A trench may be formed in the first pipe gate 1003. A pair of vertical channel holes CH may be formed on top of the trench. The pair of vertical channel holes CH may pass through the second interlayer insulating layer 1004, the boosting gate (BG) 1005, the third interlayer insulating layer 1006, the second pipe gate 1007 and the fourth interlayer insulating layer 1008.

Figure 10B:
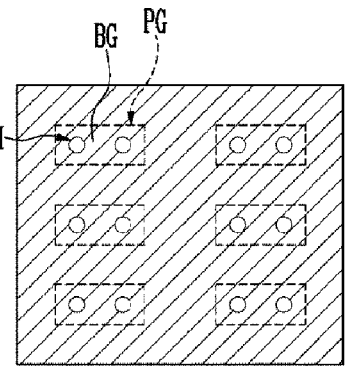

A charge trap layer 1009 may be formed along an inner wall of the trench and inner walls of the vertical channel holes CH, and a channel layer 1010 may be formed along an inner wall of the charge trap layer 1009. The channel layer 1010 formed in the trench may be the pipe channel layer PC, and the channel layer 1010 formed in the vertical channel holes CH may be the vertical channel layers. The remaining internal space of the trench and the vertical channel holes CH communicating with each other may be filled with an insulating material 1011. The boosting gate BG may contact the center of a top surface of a pipe gate PG region between the vertical channel holes CH. Referring to FIG. 10B, the boosting gate BG may be in the form of a plate that covers all the pipe channel layers PC in the entire cell block.

Figure 11A:
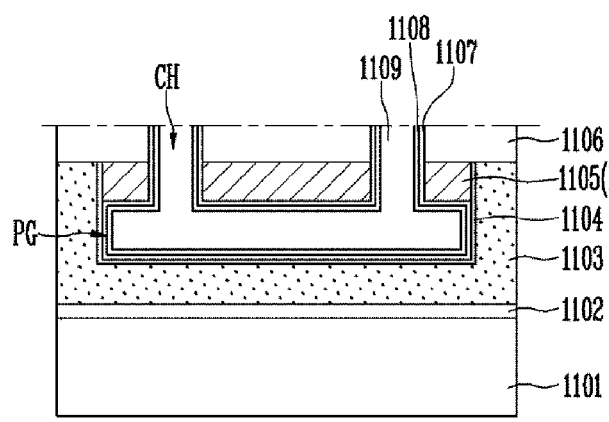

Referring to FIG. 11A, a first interlayer insulating layer 1102, a pipe gate 1103 and a second interlayer insulating layer 1106 may be sequentially stacked over a semiconductor substrate 1101. A trench may be formed in the pipe gate 1103. An insulating material 1109 may be surrounded by a charge trap layer 1107 and a channel layer 1108. The insulating material 1109 may be formed in a lower part of the trench, and the boosting gate 1105 (BG) may be formed in an upper part of the trench. In addition, a pair of vertical channel holes CH may perpendicularly pass through the boosting gate BG and the second interlayer insulating layer 1106 and contact the insulating material 1109 formed in the lower part of the trench. The charge trap layer 1107, the channel layer 1108 and the insulating material 1109 may be formed in the vertical channel holes CH.

Figure 11B:
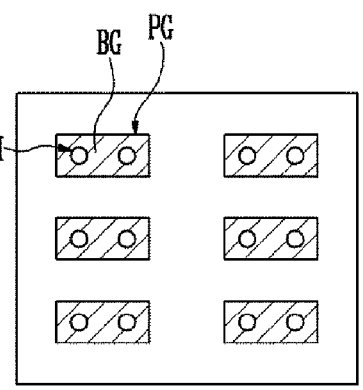

The charge trap layer 1107, the channel layer 1108 and the insulating material 1109 formed in the lower part of the trench may be the same as the charge trap layer 1107, the channel layer 1108 and the insulating material 1109 formed in the vertical channel holes CH, respectively. Referring to FIG. 11B, each boosting gate BG may be formed at a corresponding region where each pipe channel layer PC is formed. Though not shown in FIG. 11B, lines may be coupled in order to transfer voltage to each boosting gate BG.

Figure 12A:
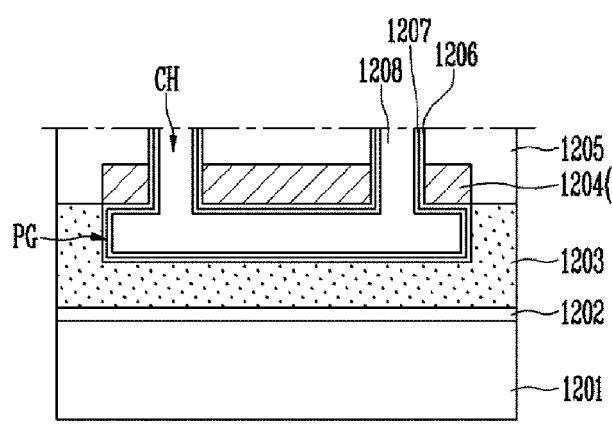
Figure 12B:
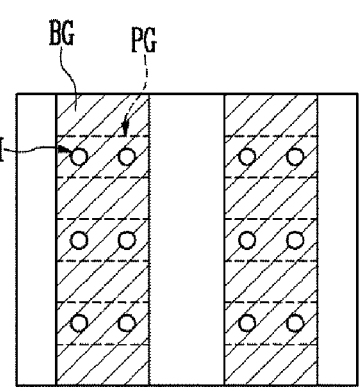

Referring to FIG. 12A, a first interlayer insulating layer 1202, a pipe gate 1203 and a second interlayer insulating layer 1205 may be sequentially stacked over a semiconductor substrate 1201. A trench may be formed in the pipe gate 1203. A boosting gate (BG) 1204 may be formed over the trench. In addition, a pair of vertical channel holes CH may be formed on top of the trench. The pair of vertical channel holes CH may pass through the boosting gate BG and the second interlayer insulating layer 1205. A charge trap layer 1206 may be formed along an inner wall of the trench and inner walls of the vertical channel holes CH, and a channel layer 1207 may be formed along an inner wall of the charge trap layer 1206. The channel layer 1207 formed in the trench may be the pipe channel layer PC, and the channel layer 1207 formed in the vertical channel holes CH may be the vertical channel layers. The remaining internal space of the trench and the vertical channel holes CH communicating with each other may be filled with an insulating material 1208. Referring to FIG. 12B, each boosting gate BG may have a linear shape with the same width as a region where the pipe channel layers PC are arranged in a predetermined direction. Also shown is a pipe gate PG.

Various examples of the semiconductor memory device in which the boosting gate BG is formed around the pipe channel layer PC have been described in brief with reference to FIGS. 7A to 12A and 7B to 12B. However, in addition to the above-described examples, another example in which the boosting gate BG is formed around the pipe channel layer PC may be provided by making various structural changes.

Figure 13:
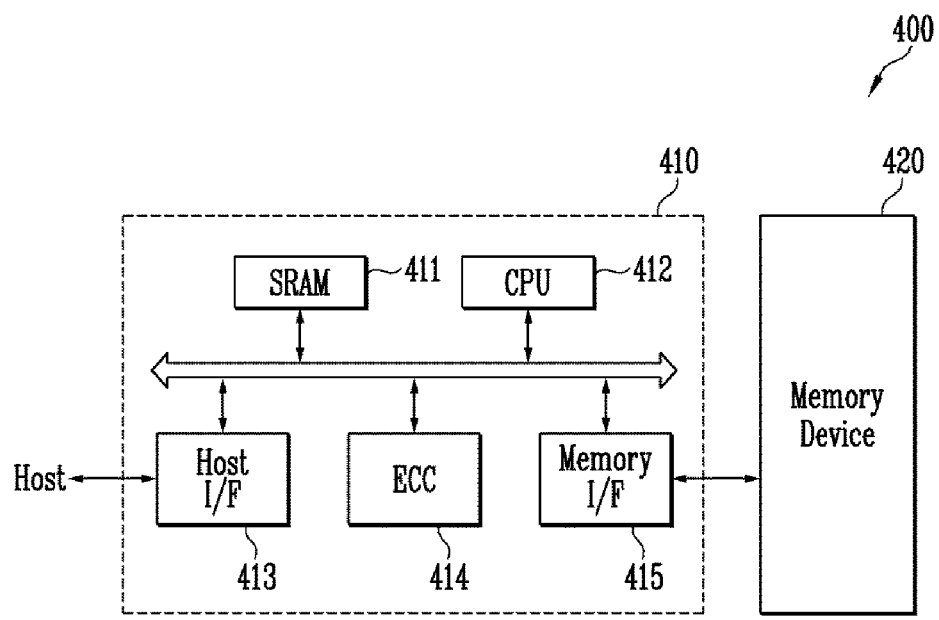
FIG. 13 is a schematic block diagram illustrating a memory system including a semiconductor memory device according to an embodiment.

FIG. 13 is a schematic block diagram illustrating a memory system including a semiconductor memory device according to an embodiment.

As illustrated in FIG. 13, a memory system 400 according to the present invention may include a memory device 420 and a memory controller 410.

The memory device 420 may include any one of the 3D semiconductor memory devices described above with reference to FIGS. 1I and 3H. In other words, the memory device 420 may include a vertical channel layer protruding upward from a substrate, a tunnel insulating layer surrounding the vertical channel layer, a charge trap layer surrounding the tunnel insulating layer, a blocking insulating layer surrounding the charge trap layer, a plurality of interlayer insulating layers stacked along the blocking insulating layer and separated from each other, and conductive layers configured as word lines and formed between the plurality of interlayer insulating layers.

The memory controller 410 may be configured to control data exchange between a host and the memory device 420. The memory controller 410 may include a CPU 412 that performs the general control operation of the memory controller 410. In addition, the memory controller 410 may include SRAM 411 that functions as an operation memory of the CPU 412. In addition, the memory controller 410 may further include a host interface (I/F) 413 and a memory interface (I/F) 415. The host I/F 413 may include a data exchange protocol between the host and the memory system 400. The memory interface 415 may couple the memory controller 410 and the memory device 420. In addition, the memory controller 410 may further include an error correction block (ECC) 414. The ECC 414 may detect and correct errors included in a data read from the memory device 420. Though not illustrated in FIG. 13, the memory system 400 may further include a Rom device that stores code data to interface with the host. The memory system 400 may be used as a portable data storage card. Alternatively, the memory system 400 may be embodied as a solid state disk (SSD) that may replace a hard disk of a computer system.

According to an embodiment, an operating time of a three-dimensional semiconductor memory device may be reduced, and the reliability of the three-dimensional semiconductor memory device may be improved.

What is claimed is:

1. A semiconductor memory device, comprising:
   a pipe channel layer;
   vertical channel layers coupled to a top surface of the pipe channel layer;
   a first pipe gate substantially surrounding a bottom surface and side surfaces of the pipe channel layer;
   a boosting gate formed over the pipe channel layer, wherein the boosting gate is formed of a first conductive layer; and
   first insulating layers and second conductive layers alternately stacked over the boosting gate and the pipe channel layer.

2. The semiconductor memory device of claim 1, wherein the boosting gate contacts the top surface of the pipe channel layer between the vertical channel layers and has a linear shape.

3. The semiconductor memory device of claim 1, further comprising a second insulating layer formed between the boosting gate and the pipe channel layer.

4. The semiconductor memory device of claim 1, further comprising a second pipe gate formed over the first pipe gate.

5. The semiconductor memory device of claim 4, wherein the boosting gate is formed in the second pipe gate between the vertical channel layers and has a linear shape.

6. The semiconductor memory device of claim 5, further comprising a second insulating layer formed between the boosting gate and the second pipe gate.

7. The semiconductor memory device of claim 1, wherein the boosting gate is in the form of a plate over the pipe channel layer and has openings through which the vertical channel layers pass.

8. The semiconductor memory device of claim 7, wherein the boosting gate has substantially the same width as a region where the pipe channel layer is formed.

9. The semiconductor memory device of claim 1, wherein the boosting gate has a linear shape so that the boosting gate passes through the first insulating layers and the second conductive layers between the vertical channel layers.

10. The semiconductor memory device of claim 1, wherein the boosting gate is in the form of a plate over the pipe channel layer and the first pipe gate.

11. The semiconductor memory device of claim 10, wherein the boosting gate is in the form of a plate in a cell block.

12. The semiconductor memory device of claim 1, wherein during a program operation, a ground voltage is supplied to the boosting gate coupled to selected cell strings, and a pass voltage is supplied to the boosting gate coupled to unselected cell strings.

13. The semiconductor memory device of claim 1, wherein during an erase operation, an erase voltage is supplied to the boosting gate.

14. The semiconductor memory device of claim 1, wherein during a read operation, a positive voltage is supplied to the boosting gate coupled to selected cell strings, and a ground voltage is supplied to the boosting gate coupled to unselected cell strings.

15. A method of manufacturing a semiconductor memory device, the method comprising:
    forming a first conductive layer configured as a first pipe gate;
    forming a first trench by etching the first conductive layer;
    filling the first trench with a sacrificial layer;
    forming a second conductive layer configured as a boosting gate over the sacrificial layer;
    alternately forming first material layers and second material layers over a resultant structure including the second conductive layer;
    forming channel holes communicating with the first trench by etching the first material layers and the second material layers;
    removing the sacrificial layer exposed on bottom surfaces of the channel holes; and
    forming a channel layer in the channel holes and the first trench from which the sacrificial layer is removed.

16. The method of claim 15, wherein the forming of the second conductive layer comprises:
    forming a third conductive layer configured as a second pipe gate over the first conductive layer filled with the sacrificial layer;
    forming a second trench having a linear shape by etching the third conductive layer, the second trench through which the sacrificial layer is exposed;
    forming an insulating layer along an inner surface of the second trench; and
    forming the second conductive layer in the second trench having the insulating layer thereon.

17. The method of claim 15, wherein the forming of the channel holes is performed by etching the first material layers, the second material layers and the second conductive layer.

18. The method of claim 15, further comprising forming an insulating layer over the first conductive layer,
wherein the forming of the first trench is performed by etching the insulating layer and the first conductive layer.

19. The method of claim 18, wherein in the forming of the second conductive layer, the second conductive layer having a linear shape and crossing the sacrificial layer is formed over the first conductive layer filled with the sacrificial layer and the insulating layer.

20. The method of claim 19, wherein the forming of the channel holes is performed by etching the second conductive layer, the first material layers and the second material layers.

21. The method of claim 18, wherein in the forming of the second conductive layer, the second conductive layer in the form of a plate is formed over the first conductive layer filled with the sacrificial layer and the insulating layer.

22. The method of claim 15, wherein the second conductive layer is formed of tungsten (W), tungsten-silicide (WSix), copper (Cu), copper-silicide (CuSix), or aluminum (Al).

23. A method of manufacturing a semiconductor memory device, the method comprising:
    forming a first conductive layer configured as a first pipe gate;
    forming a first trench by etching the first conductive layer;
    filling the first trench with an auxiliary layer;
    doping the auxiliary layer with impurities by a predetermined depth and transforming a top portion of the auxiliary layer into a second conductive layer;
    alternately forming first material layers and second material layers over a resultant structure including the second conductive layer;
    forming channel holes coupled to the second conductive layer by etching the first material layers and the second material layers;
    forming a channel layer in the channel holes;
    forming a second trench through which the second conductive layer is exposed by etching the first material layers and the second material layers between the channel holes; and
    filling the second trench with a third conductive layer configured as a boosting gate.

24. The method of claim 23, wherein the auxiliary layer comprises an undoped polysilicon layer.

25. The method of claim 23, wherein the filling of the second trench with the third conductive layer comprises:
    forming an insulating layer along a sidewall of the second trench; and
    filling the third conductive layer with the second trench having the insulating layer thereon.

26. The method of claim 23, wherein the third conductive layer is formed of tungsten (W), tungsten-silicide (WSix), copper (Cu), copper-silicide (CuSix), or aluminum (Al).

* * * * *